United States Patent
Konuk

Patent Number: 5,963,046
Date of Patent: Oct. 5, 1999

[54] METHOD FOR DETECTING AND LOCATING OPEN-CIRCUIT DEFECTS WITHIN DIGITAL CMOS INTEGRATED CIRCUITS

[75] Inventor: Haluk Konuk, Mountain View, Calif.

[73] Assignee: Hewlett-Packard Company, Palo Alto, Calif.

[21] Appl. No.: 08/821,834

[22] Filed: Mar. 21, 1997

[51] Int. Cl.$^6$ .................................................... G01R 31/26

[52] U.S. Cl. ............................................ 324/765; 324/537

[58] Field of Search ............................... 324/158.1, 73.1, 324/763, 765, 716, 719, 500, 537; 438/14, 17, 18; 714/700, 25, 715, 733, 734; 257/40, 48

[56] References Cited

U.S. PATENT DOCUMENTS

| | | | |
|---|---|---|---|
| 5,392,293 | 2/1995 | Hsue | 324/765 |
| 5,670,892 | 9/1997 | Sporck | 324/765 |
| 5,818,239 | 10/1998 | Scaman | 324/537 |

*Primary Examiner*—Vinh P. Nguyen
*Attorney, Agent, or Firm*—Brian R. Short

[57] ABSTRACT

A method of detecting open circuit defects within an integrated circuit. The invention includes locating a conductive plate proximate to a top surface of the integrated circuit. A voltage potential is coupled to the conductive plate. The voltage potential of the conductive plate couples to open circuit interconnections within the integrated circuit. Open circuit interconnections are identified by monitoring the quiescent current conducted by the integrated circuit while controlling the voltage on the conductive plate and controlling inputs to the integrated circuit.

9 Claims, 4 Drawing Sheets

5,963,046

METHOD FOR DETECTING AND LOCATING OPEN-CIRCUIT DEFECTS WITHIN DIGITAL CMOS INTEGRATED CIRCUITS

FIELD OF INVENTION

This invention relates generally to an apparatus and method of detecting defects within an integrated circuit. In particular, it relates to an apparatus and method of detecting and locating interconnect open circuits within an integrated circuit by coupling a voltage onto open circuit interconnections within the integrated circuit and analyzing the resultant Iddq current conducted by the integrated circuit.

BACKGROUND

Complementary metal oxide silicon (CMOS) integrated circuits are popular because of their low power consumption characteristics. An ideal CMOS circuit conducts a negligible amount of current when the CMOS circuit is in standby or a quiescent state. Therefore, when a CMOS circuit is not switching states, only a small amount of quiescent current should be conducted by the CMOS circuit. The quiescent current, commonly referred to as Iddq, is composed primarily of leakage current. Iddq is the IEEE symbol for the quiescent power supply current in metal oxide silicon (MOS) circuits. A faulty CMOS circuit may draw a significantly larger amount of current than a properly functioning CMOS circuit when in the quiescent state.

Typically, Iddq testing includes setting a threshold value of Iddq in which the integrated circuit being tested is failed if the Iddq current conducted by the integrated circuit exceeds the threshold value. The Iddq current is measured while inputs to the integrated circuit are driven high or low depending on pre-determined states of input test vectors. Iddq testing includes stepping through many different combinations of input test vectors to exercise the functionality within the integrated circuit. The test vectors can be generated by automatic test pattern generation (ATPG) software tools, or by integrated circuit designers.

FIG. 1 shows a standard CMOS gate 10 within an integrated circuit. FIG. 1 also shows the Iddq current conducted by the CMOS gate 10. FIG. 2 shows standard input (Vin) and output (Vout) waveforms of the CMOS gate 10. FIG. 2 also shows the Iddq current conducted by the CMOS gate 10 when there is a defect 21 and when there is not a defect 23.

An interconnect open is an open-circuit defect that occurs in the interconnect wiring of an integrated circuit. The interconnect open disconnects at least one logic gate from whatever is intended to drive the logic gate. The interconnect open results in a floating wire in the integrated circuit.

Continual increases in integrated circuit density and complexity requires integrated circuits to include more interconnections. The interconnections include vias which are particularly susceptible to breaking and resulting in open circuit interconnections. In many microprocessor designs, the number of vias exceeds the number of transistors. Therefore, interconnect wiring is a likely place for an open-circuit defect to occur.

Conventional Iddq testing does not target specific types of defects. Rather, conventional Iddq testing includes exercising the functionality of an integrated circuit hoping to trigger fabrication defects. The inputs to the integrated circuit are set high or low depending on test vectors which are generated to exercise the functionality of the gates within the integrated circuit. This methodology does detect many defects. However, this methodology is inadequate to detect all possible defects within CMOS circuits.

It is desirable to have a method of Iddq testing which provides for a greater likelihood of detection of open circuit defects of interconnection lines within integrated circuits. It is also desirable that the method be easily incorporated into presently existing Iddq integrated circuit defect detection testing

SUMMARY OF THE INVENTION

The present invention is an apparatus and method for improving the detection of open circuit defects of interconnection lines within integrated circuits. The invention includes placing at least one conductive plate proximate to the surface of an integrated circuit. Open circuit defects of interconnections within the integrated circuit can be detected by controlling the voltage potential on the conductive plate and analyzing the quiescent current conducted by the integrated circuit.

A first embodiment of the invention includes an apparatus for detecting open circuit defects of interconnection lines within an integrated circuit. This embodiment includes connecting a supply voltage to voltage supply terminals of the integrated circuit. This embodiment further includes measuring Iddq current being conducted by the supply terminals of the integrated circuit. A conductive plate is located proximate to the integrated circuit. The conductive plate has a plate voltage which couples to open connections within the integrated circuit. The plate voltage is set to a predetermined voltage or adjusted over a voltage potential range. Monitoring the Iddq current drawn by the integrated circuit can identify open circuit defects of the interconnection lines.

Another embodiment of the invention is similar to the first embodiment, but includes a plurality of conductive tiles proximate to the surface of the integrated circuit. Each conductive tile can be used to detect open circuit defects within a corresponding section of the integrated circuit.

Other aspects and advantages of the present invention will become apparent from the following detailed description, taken in conjunction with the accompanying drawings, illustrating by way of example the principles of the invention.

DETAILED DESCRIPTION

Figure 1:
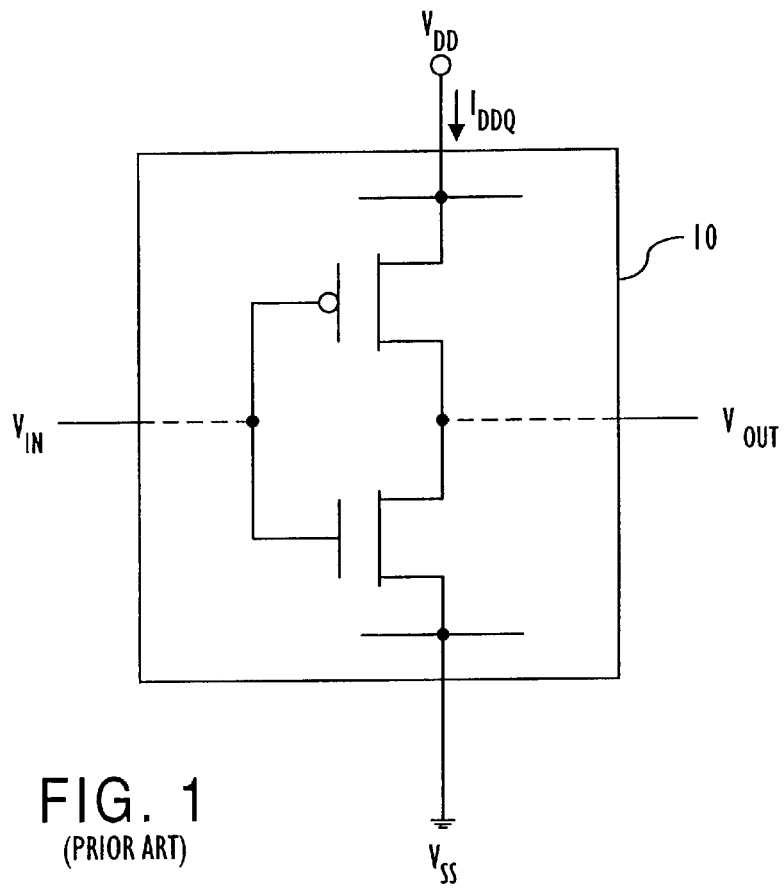
FIG. 1 shows a CMOS inverter circuit.
Figure 2:
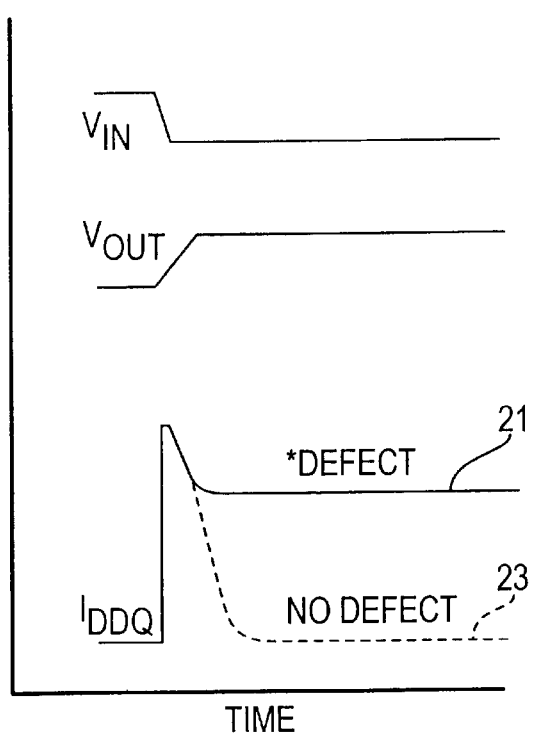
FIG. 2 is a plot of Iddq for a defective CMOS circuit and a defect-free CMOS circuit.

As shown in the drawings for purposes of illustration, the invention is embodied in an apparatus and method for detecting open circuit defects of interconnections within an integrated circuit. The invention is easily incorporated into existing Iddq testing methods.

Figure 3:
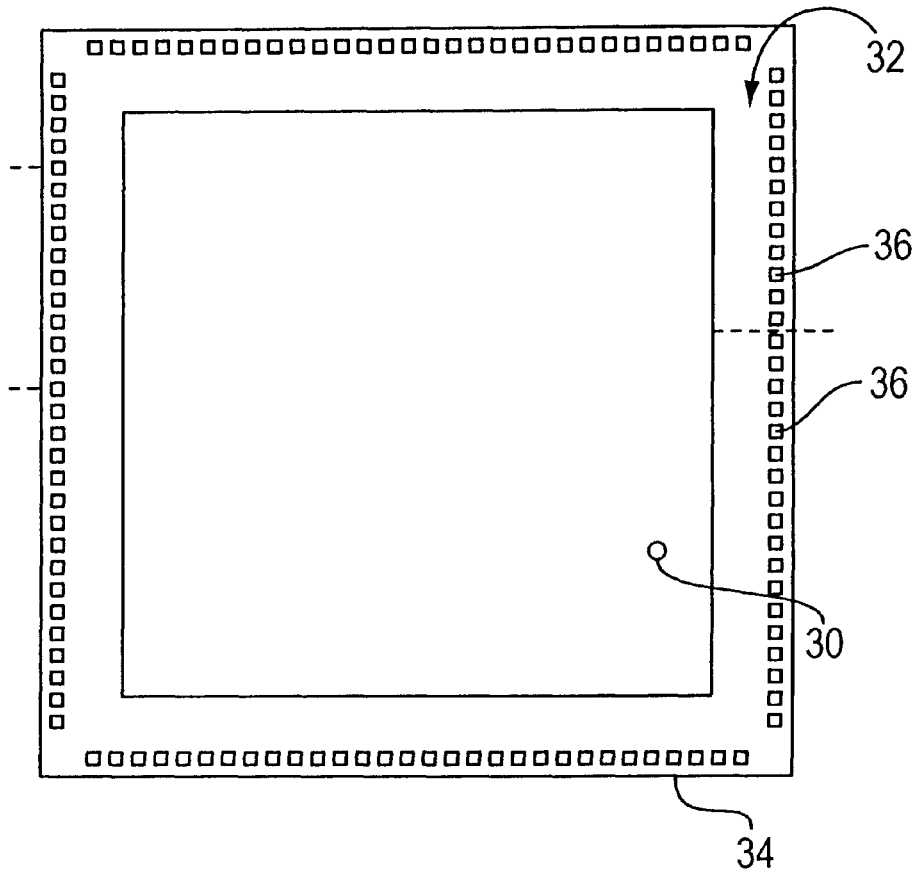
FIG. 3 shows a top view of an embodiment of the invention.
Figure 4:
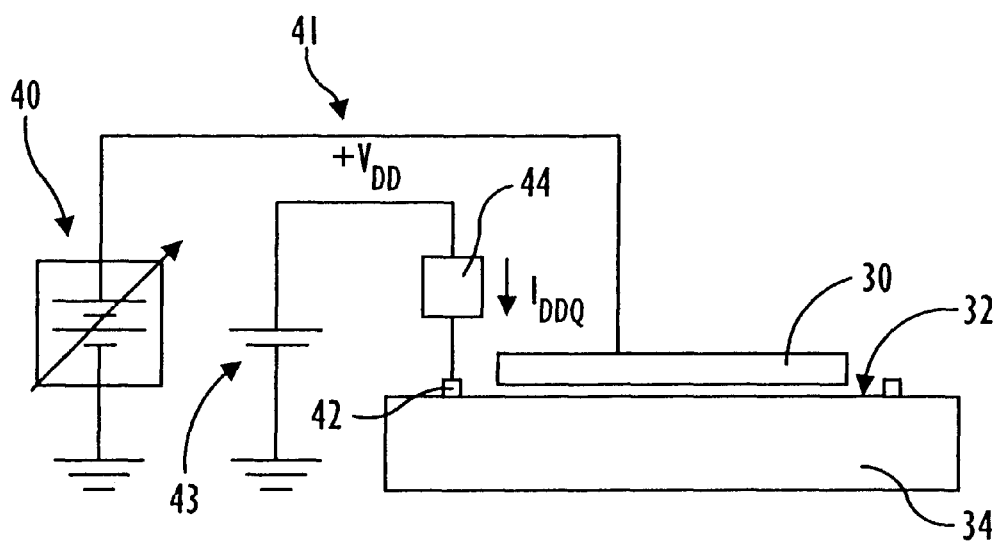
FIG. 4 shows a side view of the same embodiment as shown in FIG. 3.

FIG. 3 and FIG. 4 show an embodiment of the invention. A conductive plate 30 is placed proximate with a top surface 32 of an integrated circuit die 34 before the integrated circuit die 34 is packaged. The top surface 32 is typically a passivation layer. The conductive plate 30 may physically contact the top surface 32 if contact with the top surface 32 will not damage the passivation layer.

A voltage potential is coupled to the conductive plate 30. The voltage potential can be coupled to the conductive plate 30 by connecting an adjustable voltage supply 40 through a conductive wire 41 to the conductive plate 30. The voltage potential of the conductive plate 30 will couple to open circuit interconnections within the integrated circuit die 34. Therefore, the voltage potential of open circuit interconnections within the integrated circuit die 34 can be affected by adjusting the voltage potential of the conductive plate 30.

Voltage supply terminals 42 of the integrated circuit die 34 are connected to a voltage supply 43 through an ammeter 44. The ammeter 44 measures the Iddq current conducted by the integrated circuit 44. The voltage supply 43 and the ammeter 44 are standard components of integrated circuit testers which monitor the Iddq current conducted by an integrated circuit.

Similar to standard Iddq testing methods, the inputs to the integrated circuit die 34 are set to logic levels of high or low by input test vectors to exercise the functionality of logic gates within the integrated circuit die 34. Simultaneously, the voltage potential coupled to the conductive plate 30 is set to a predetermine level. Alternately, the voltage potential coupled to the conductive plate 30 is variable rather than static.

Presently existing wafer probing equipment can individually probe conductive pads 36 of the integrated circuit die 34. The same technology can be utilized to place the conductive plate 30 proximate to the integrated circuit die 34. That is, the wafer probing equipment includes probers which are placed on the conductive pads 36 with a high degree of precision. The conductive pads 36 can be as small as 70 microns across. The conductive plate 30 can be as large as 1 cm accross. The conductive plate 30 can be attached to the same type of mechanism that the probers are attached and placed proximate with the top surface 32 of the integrated circuit die 34.

Figure 5:
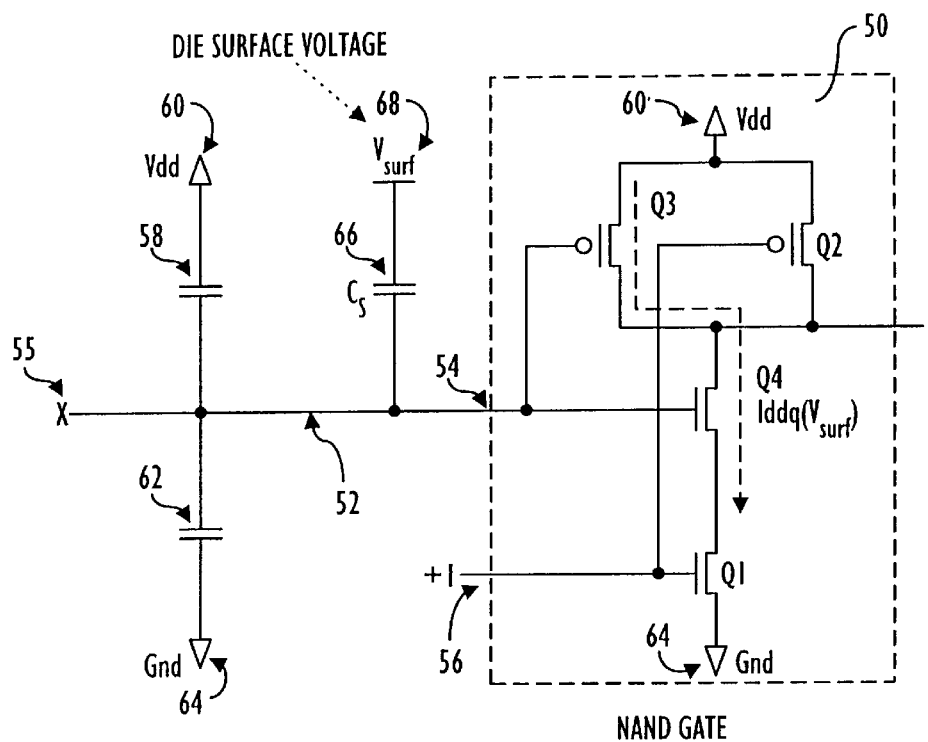
FIG. 5 is a schematic of a CMOS NAND gate which has an open-circuit defect.

FIG. 5 is a schematic of a CMOS NAND gate 50 in which an interconnection 52 connected to a first input 54 of the NAND gate 50 has an open circuit defect 55. A second input 56 of the NAND gate 50 is driven to a logic value of +1. That is, the voltage potential at the second input 56 is high enough to turn on transistor Q1. The CMOS NAND gate 50 is within an integrated circuit which includes a Vdd power supply 60 at a voltage potential of Vdd and a circuit ground 64 at a ground potential. A first capacitor 58 represents a capacitance between the interconnection 52 and the Vdd power supply 60. A second capacitor 62 represents a capacitance between the interconnection 52 and the circuit ground 64. The first capacitor 58 and the second capacitor 62 each have a capacitance of about 30 femto farads (fF).

The schematic of FIG. 5 also includes a surface capacitor 66 which represents the capacitance between the interconnection 52 and the conductive plate 30 shown in FIG. 3. The surface capacitor 66 will also have a capacitance of about 30 fF. The voltage source Vsurf 68 represents the voltage coupled onto the conductive plate 30 or the surface 32 of the integrated circuit die 34 if the conductive plate is in contact with the top surface 32 of the integrated circuit die 34. As the voltage potential coupled to the conductive plate 30 increases, the voltage potential coupled to the first input 54 of the NAND gate 50 increases. With the voltage potential to the second input 56 set to a logic of +1, transistor Q4 will turn on when the voltage potential coupled to the first input reaches a high enough voltage potential. At this state, the quiescent current conducted by the NAND gate 50 will increase as the voltage potential coupled to the first input continues to increase. Monitoring the Iddq current conducted by the NAND gate allows detection of open circuit interconnections. If an open circuit defect does not exist, then Iddq will not vary with variations in the voltage coupled to the conductive plate 30.

The values of capacitance of the first capacitor 58 and the second capacitor 62 are determined by the circuit layout and the input vectors applied to the integrated circuit. The cumulative capacitance of capacitor 58 and capacitor 62 is determined by the physical characteristics of the integrated circuit around the location of the open circuit defect 55. On average, the capacitance of capacitor 58 will be approximately equal to the capacitance of capacitor 62. However, the input test vectors applied to the integrated circuit and the layout surrounding a particular open circuit defect 55 will typically result in the capacitance of capacitor 58 being unequal to the capacitance of capacitor 62. Therefore, tyically the voltage potential of the open circuit defect will not be Vdd/2. As will be discussed later, Vdd/2 is generally an optimal target voltage for testing for open circuit defects. The presense of the conductive plate 30 proximate to the integrated circuit 34 allows adjustment of the open circuit defect 55 to a voltage potential near Vdd/2.

Figure 6:
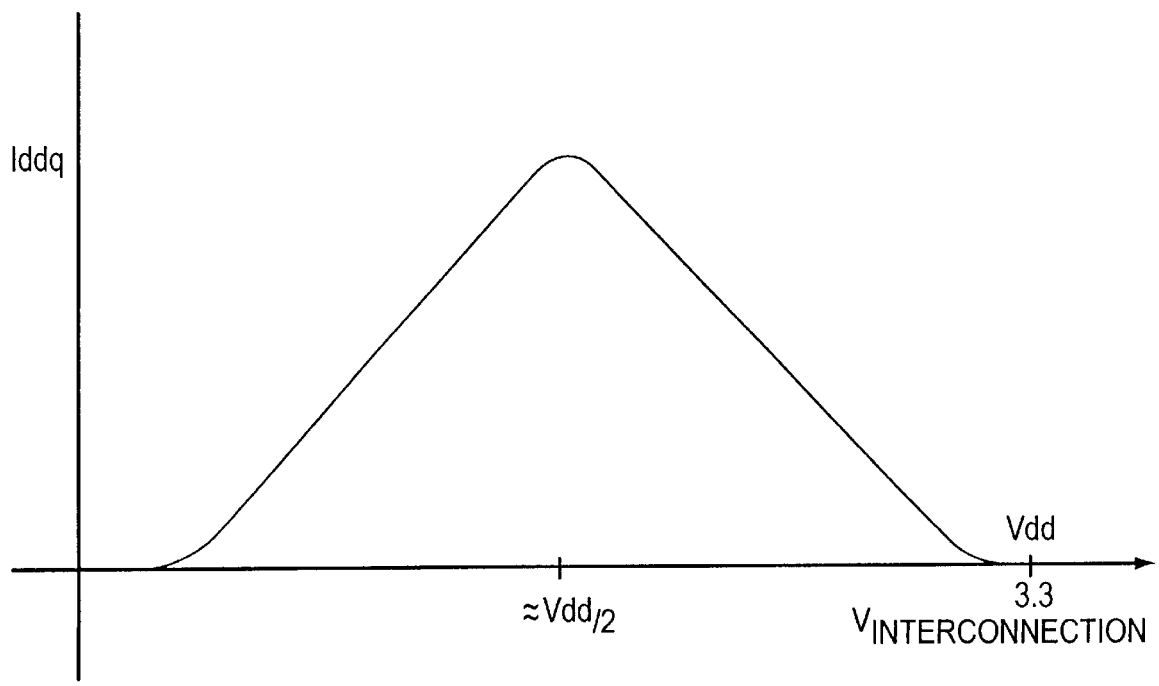
FIG. 6 is a plot of the Iddq current draw by the defective gate of FIG. 5 as a voltage coupled to the surface of the die which the defective gate is located is varied.

FIG. 6 is a plot showing the current Iddq drawn by the NAND gate 50 as a function of the voltage potential coupled to the interconnection 52. The voltage potential on the Vdd power supply 60 is constant for the plot shown in FIG. 6. Furthermore, the first capacitor 58, the second capacitor 60 and the surface capacitor 66 all have fixed values of capacitance.

With the voltage potential of the interconnection 52 at zero volts, Iddq is approximately zero. As the voltage potential of the interconnection 52 increases, transistor Q4 begins to conduct and Iddq begins to increase. When the interconnection voltage is at a voltage potential of about Vdd/2, the Iddq current conducted by the NAND gate 50 is at a maximum value. As the interconnection voltage is further increased, the Iddq current conducted by the NAND gate 50 begins to decrease. As the voltage potential of the interconnection voltage is increased, transistor Q3 begins to turn off. Once the voltage potential of the interconnection voltage increases enough to completely turn off transistor Q3, Iddq again becomes approximately zero. Again, the voltage potential of the interconnection line 52 can be varied by adjusting the voltage potential coupled to conductive plate 30.

Uses of the invention include production testing and failure analysis of integrated circuits. Production testing requires quick determination of the existence of defects. Failure analysis require a more complete and detailed analysis of known defects.

Production testing can utilize this invention to increase the number of defects detected during conventional Iddq testing. The presence of the conductive plate 30 biased to a predetermined fixed voltage increases the likelihood of detecting open circuit defects within integrated circuits during production testing. For example, the voltage plate 30 may be used to set the surface of the integrated circuit die 34 to a voltage of Vdd/2 while performing Iddq testing. The presence of the conductive plate will raise the voltage potential of any open circuit interconnections closer to the voltage potential of Vdd/2. The result being that an open circuit interconnection is more likely to be detected during Iddq testing.

Failure analysis of defects can utilize this invention to vary the voltage potential of open circuit interconnections and observe the resultant Iddq current. As the curve in FIG. 6 depicts, the Iddq current of a CMOS gate varies as a function of the voltage potential of an open circuit interconnection connected to the input of the CMOS gate. If a open circuit defect does not exist, then the Iddq current will not vary as depicted in FIG. 6.

Figure 7:
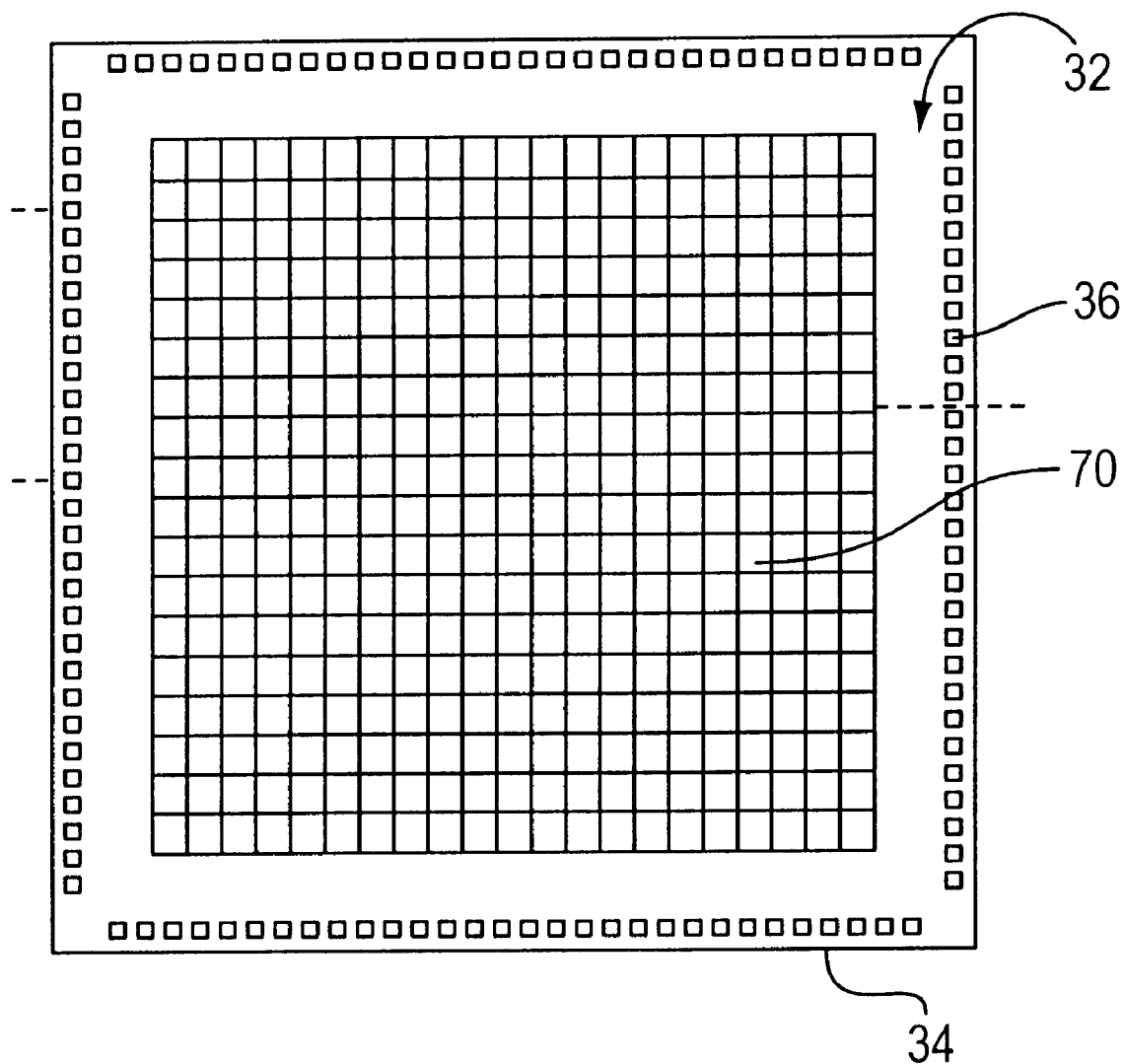
FIG. 7 shows another embodiment of the invention in which the conductive plate shown in FIG. 3 is divided into many conductive tiles.

FIG. 7 is another embodiment of the invention. The embodiment includes the conductive plate being sectioned into many small conductive tiles 70. Each of the conductive tiles 70 is located over a different section of the top surface 32 of the integrated circuit die 34. Each conductive tile is at a controllable voltage potential. The vast number of individually located conductive tiles allows greater isolation of open circuit defects within the circuitry of the integrated circuit die 34.

Although specific embodiments of the invention have been described and illustrated, the invention is not to be limited to the specific forms or arrangements of parts so described and illustrated. The invention is limited only by the claims.

What is claimed is:

1. An apparatus for detecting open circuit defects of interconnection lines within an integrated circuit, the apparatus comprising:

a voltage supply connected to voltage supply terminals of the integrated circuit;

an ammeter for measuring the Iddq current conducted by the voltage supply terminals of the integrated circuit;

a conductive plate proximate to the integrated circuit, the conductive plate having a voltage potential which couples to open circuit defects within the integrated circuit; and an adjustable voltage supply connected to the conductive plate for controlling the voltage potential of the conductive plate.

2. The apparatus for detecting open circuit defects of interconnection lines within an integrated circuit as recited in claim 1, wherein the conductive plate is sectioned into a plurality of conductive tiles proximate to the integrated circuit, each conductive tile having a tile voltage which couples to open circuit interconnections within a corresponding portion of the integrated circuit.

3. The apparatus for detecting open circuit defects of interconnection lines within an integrated circuit as recited in claim 1, wherein the adjustable voltage supply adjustably controls the voltage potential of the conductive plate.

4. The apparatus for detecting open circuit defects of interconnection lines within an integrated circuit as recited in claim 1, wherein the ammeter monitors the Iddq current and detects variations in the Iddq current with variations in the voltage potential of the conductive plate.

5. The apparatus for detecting open circuit defects of interconnection lines within an integrated circuit as recited in claim 1, wherein the conductive plate physically contacts a top surface of the integrated circuit.

6. A method for detect open circuit defects within an integrated circuit, the integrated circuit having a power supply node connected to a power supply, the power supply node conducting a quiescent current of Iddq, the integrated circuit having a plurality of input nodes, the method comprising:

a. placing a conductive plate proximate to a top surface of the integrated circuit;

b. setting a voltage potential coupled to the conductive plate to a predetermined value;

c. driving the input nodes to logic levels of high and low; and d. measuring the Iddq current conducted by the integrated circuit, e. detecting whether the measured Iddq value exceeds a threshold value, wherein the threshold value is a standard Iddq testing threshold value.

7. An apparatus for detecting open circuit defects of interconnection lines within an integrated circuit, the apparatus comprising:

a voltage supply connected to voltage supply terminals of the integrated circuit;

an ammeter for measuring the Iddq current conducted by the voltage supply terminals of the integrated circuit;

a conductive plate proximate to the integrated circuit, the conductive plate having a voltage potential which couples to open circuit defects within the integrated circuit; and an adjustable voltage supply connected to the conductive plate for controlling the voltage potential of the conductive plate; wherein an open circuit defect is detected if the measured Iddq current exceeds a threshold value of Iddq, wherein the threshold value is a standard Iddq testing threshold value.

8. An apparatus for detecting open circuit defects of interconnection lines within an integrated circuit, the apparatus comprising:

a voltage supply connected to voltage supply terminals of the integrated circuit;

an ammeter for measuring the Iddq current conducted by the voltage supply terminals of the integrated circuit;

a conductive plate proximate to the integrated circuit, the conductive plate having a voltage potential which couples to open circuit defects within the integrated circuit; and an adjustable voltage supply connected to the conductive plate for controlling the voltage potential of the conductive plate; wherein the ammeter monitors the Iddq current and detects variations in the Iddq current with variations in the voltage potential of the conductive plate, thereby indicating that the integrated circuit has an open circuit defect.

9. A method for detect open circuit defects within an integrated circuit, the integrated circuit having a power supply node connected to a power supply, the power supply node conducting a quiescent current of Iddq, the integrated circuit having a plurality of input nodes, the method comprising:

a. placing a conductive plate proximate to a top surface of the integrated circuit;

b. variably setting a voltage potential coupled to the conductive plate;

c. driving the input nodes to logic levels of high and low; and d. measuring the Iddq current conducted by the integrated circuit, e. detecting variations in the measured Iddq current with variations in the voltage potential, thereby indicating a defect exists on the integrated circuit.

* * * * *